United States Patent
Iriarte et al.

(10) Patent No.: US 8,866,499 B2
(45) Date of Patent: Oct. 21, 2014

(54) SYSTEM AND METHOD FOR MEASURING CAPACITANCE

(75) Inventors: Santiago Iriarte, Valencia (ES); Mark Murphy, Kilmore (IE)

(73) Assignee: Analog Devices, Inc., Norwood, MA (US)

(*) Notice: Subject to any disclaimer, the term of this patent is extended or adjusted under 35 U.S.C. 154(b) by 591 days.

(21) Appl. No.: 12/548,540

(22) Filed: Aug. 27, 2009

(65) Prior Publication Data

US 2011/0050255 A1  Mar. 3, 2011

(51) Int. Cl.
*G01R 27/26*  (2006.01)

(52) U.S. Cl.
CPC .................... *G01R 27/2605* (2013.01)
USPC ........... 324/684; 324/678; 324/677; 324/519; 324/115; 324/244.1; 324/750.17; 264/1.25

(58) Field of Classification Search
CPC ... G01R 27/26; G01R 27/2605; G01R 31/028
USPC ........ 324/244.1, 677, 678, 679, 115; 264/125
See application file for complete search history.

(56) References Cited

U.S. PATENT DOCUMENTS

| | | | |
|---|---|---|---|
| 3,824,459 A | 7/1974 | Uchida | |
| 5,576,628 A * | 11/1996 | Caliboso et al. | 324/678 |
| 7,498,822 B2 | 3/2009 | Lee | |
| 2003/0173989 A1 | 9/2003 | Rearick et al. | |
| 2008/0191713 A1 * | 8/2008 | Hauer et al. | 324/658 |
| 2009/0021884 A1 | 1/2009 | Nakamura | |
| 2009/0174417 A1 | 7/2009 | Remmers et al. | |

FOREIGN PATENT DOCUMENTS

| | | |
|---|---|---|
| JP | 04251579 A | 9/1992 |
| JP | 06242159 A | 9/1994 |
| JP | 09043284 A | 2/1997 |
| JP | 11064410 A | 3/1999 |
| JP | 2004-184275 A | 7/2004 |
| JP | 2008-518227 | 5/2008 |
| WO | 2006/046218 A1 | 5/2006 |
| WO | 2007/110928 A1 | 10/2007 |

OTHER PUBLICATIONS

International Search Report dated Oct. 21, 2010, in counterpart International application No. PCT/US2010/046919.
J. O'Dowd et al., "Capacitive Sensor Interfacing Using Sigma-Delta Techniques," IEEE 2005 Sensors Conference, Oct. 30-Nov. 3, 2005, 4 pages.
Office Action issued in JP Application No. 2012-527012 dated Apr. 7, 2014, 10 pages (with EN translation).
Office Action issued in the corresponding TW Appln. No. 099128984, dated Nov. 20, 2013, 15 pages (with English translation).

* cited by examiner

*Primary Examiner* — Arleen M Vazquez
*Assistant Examiner* — Son Le
(74) *Attorney, Agent, or Firm* — Kenyon & Kenyon, LLP

(57) ABSTRACT

A system and method for testing capacitance of a load circuit connected to an output pin of a driving circuit In one embodiment, the method may comprise driving a voltage at the output pin to a first voltage; a predetermined current to the output pin; comparing the voltage at the output pin to a reference voltage; and when the voltage at the output pin matches the reference voltage, generating an estimate of capacitance present at the output pin based on a number of clock cycles occurring between an onset of a timed voltage change period and a time at which the voltage at the output pin matches the reference voltage.

26 Claims, 6 Drawing Sheets

SYSTEM AND METHOD FOR MEASURING CAPACITANCE

BACKGROUND

The present invention is generally directed to testing capacitance of a circuit. In particular, the present invention is directed to a device and method for detecting the capacitance of a circuit coupled to an output of a driving circuit.

Testing capacitance of a circuit has long been performed. Testing capacitance of a circuit coupled to an output of a driving circuit (e.g., an IC chip) has posted a new challenge. Nowadays, integrated circuits chips are widely used to control or drive a variety of actuators (e.g., micro actuator, Micro-ElectroMechanical Systems (MEMS) actuator). For example, ICs are used in electronic appliances such as cameras to control or drive a motor that drives an adjustable mechanical component (e.g., a lens). An actuator coupled to an IC chip may appear as a capacitor coupled to an output pin of the IC chip.

It would be desirable for an IC chip to test capacitance of a circuit coupled to an output of the IC chip (e.g., to determine on its own whether a load device is connected to chip pin before driving the pin with an activating current.) No known tests are available that provide a simple, inexpensive circuit for this purpose. Accordingly, there is a need in the art for a circuit that efficiently tests for capacitance of a circuit coupled to an IC pin with minimal complexity.

DETAILED DESCRIPTION

A system and method for testing capacitance of a load circuit connected to an output pin of a driving circuit In one embodiment, the method may comprise driving a voltage at the output pin to a first voltage; a predetermined current to the output pin; comparing the voltage at the output pin to a reference voltage; and when the voltage at the output pin matches the reference voltage, generating an estimate of capacitance present at the output pin based on a number of clock cycles occurring between an onset of a timed voltage change period and a time at which the voltage at the output pin matches the reference voltage.

Figure 1A:
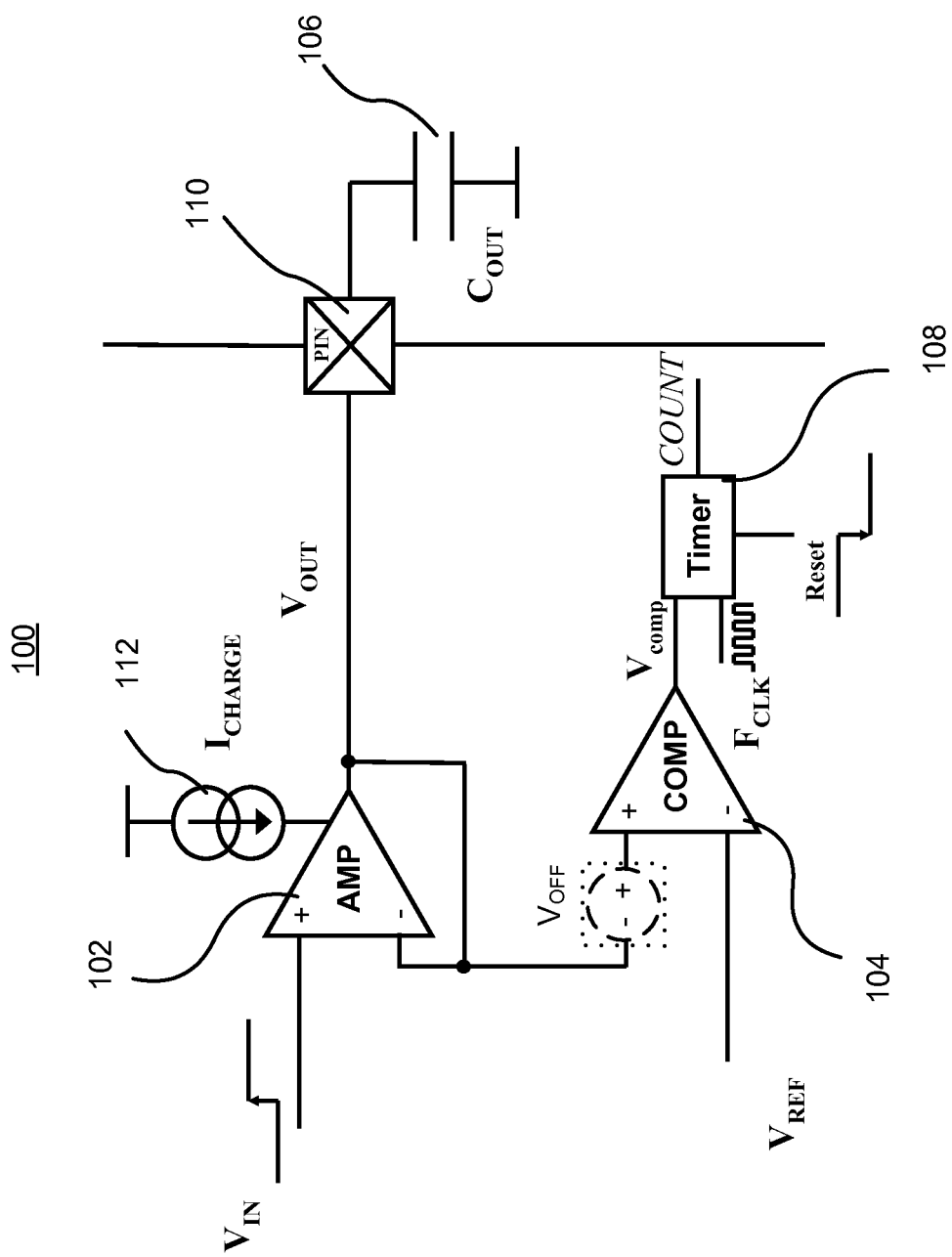
FIGS. 1A and 1B are schematic diagrams of a capacitance sensing circuit in accordance with an exemplary embodiment of the present invention.

FIG. 1A is a schematic diagram of a capacitance sensing circuit 100 in accordance with an exemplary embodiment of the present invention. The capacitance sensing circuit 100 may comprise an amplifier 102, a comparator 104 and a counter (e.g., timer) 108. The amplifier 102 may generate an output voltage that is applied to an output pin 110. The comparator 104 may compare the voltage applied to the output pin 110 to a reference voltage $V_{REF}$. In one embodiment, the capacitance sensing circuit 100 may be provided within a common IC chip. A load circuit (e.g. a load device modeled as capacitor 106 in FIG. 1) may be coupled to the IC chip via the pin 110.

The amplifier 102 may take an input signal $V_{IN}$ at one input pin and take the output voltage $V_{OUT}$ at another input pin via a feedback path. The output voltage $V_{OUT}$ may match the input voltage $V_{IN}$ with a response delay. The response delay may be affected by how fast the voltage $V_{OUT}$ may match to the $V_{IN}$. Thus, the response delay may be affected by how fast the load circuit may be charged. In this embodiment, the charge current may be provided by the output current of the amplifier 102, which may be controlled by a current source 112. The current source 112 may provide a constant charge current $I_{CHARGE}$ to the output electrical current of the amplifier 102. In one embodiment, the amplifier 102 may be a voltage output amplifier and the input $V_{IN}$ may be coupled to an output from a digital to analog converter (DAC). In another embodiment, the feedback signal may be coupled via a resistive divider.

The comparator 104 and counter 108 may estimate the response time for the load circuit coupled to the pin 110 to be charged to a certain voltage. For example, if a load device (e.g., capacitor 106) is coupled to the pin 110, the load device may have a capacitance. The capacitance may be determined by the response delay for output voltage $V_{OUT}$ to match the reference voltage $V_{REF}$. The output signal $V_{COMP}$ of the comparator 104 may be coupled to an input pin of the counter 108. Another input pin of the counter 108 may be coupled to a clock signal $F_{CLK}$. Thereby, the counter 108 may count the response time (e.g., the response delay) for the output voltage $V_{OUT}$ to match the reference voltage $V_{REF}$. Accordingly, the capacitance of the load circuit may be determined. In one embodiment, the counter 108 may be part of a decision logic (not shown) the capacitance sensing circuit 100 to estimate the capacitance of the load circuit coupled to the pin 110. The estimation of the capacitance may be based on the estimated response time for the load circuit coupled to the pin 110 to be charged to the reference voltage. In one or more embodiments, whether a load device may be present may be determined based on the capacitance.

In the embodiment as shown in FIG. 1A, the output signal $V_{OUT}$ may be connected to the input pin of the comparator 104 directly for the comparator 104 to compare $V_{OUT}$ to $V_{REF}$.

In another embodiment, the reference voltage used by the comparator 104 may be the input voltage $V_{IN}$. Thus, the output voltage $V_{OUT}$ may be compared with the input voltage $V_{IN}$. The capacitance may be determined by the response delay for output voltage $V_{OUT}$ to match the input voltage $V_{IN}$. However, as shown in FIG. 2(a), the rise of the output voltage $V_{OUT}$ may not be linear when the level approaches the input voltage $V_{IN}$. Therefore, the output signal $V_{OUT}$ may be connected to an input pin of the comparator 104 via an offset voltage $V_{OFF}$ (shown in dashed lines).

Figure 1B:
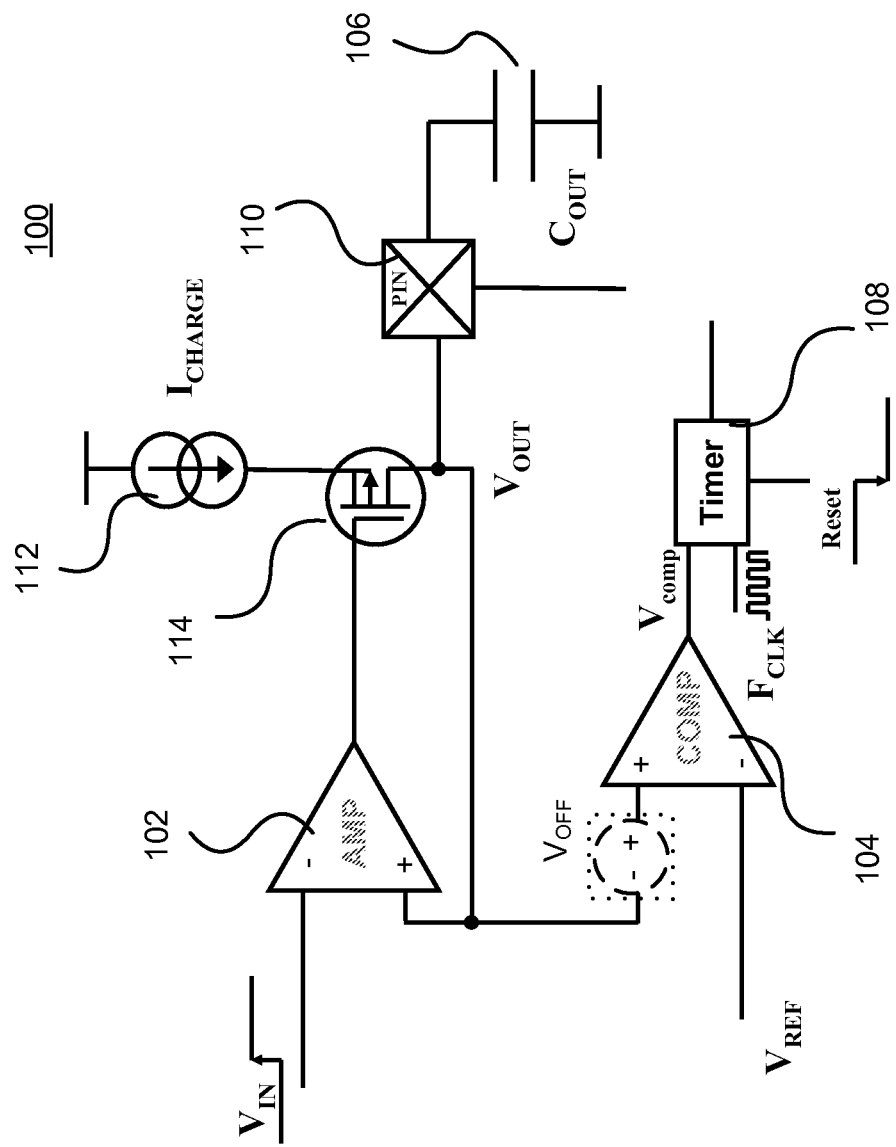

FIG. 1B is a schematic diagram of showing the capacitance sensing circuit 100 with more detail in the output portion of the amplifier 102. The output portion of the amplifier 102 may comprise a transistor 114 and the current source 112 may be coupled to one terminal of the transistor 114. The output pin 110 may be coupled to another terminal of the transistor 114. The control terminal of the transistor 114 may be coupled to an output of the amplifier 102. In the embodiment shown in FIG. 1B, the transistor 114 may be a PMOS transistor. However, the transistor 114 is not limited to only PMOS transistors but may be a NMOS transistor or a bipolar transistor (either p-channel or n-channel).

In one embodiment, the capacitance sensing circuit 100 may comprise another transistor (e.g., a NMOS transistor, not shown) as a current sink coupling the drain of the PMOS transistor 114 to ground. The gate of the NMOS transistor may be coupled to the output of the amplifier 102 similar to the PMOS transistor 114. Because the PMOS transistor 114 may inverse the output signal of the amplifier 102, the positive and negative inputs to the amplifier 102 of FIG. 1B may be switched compared to the amplifier 102 of FIG. 1A to generate similar output signals at the output pin 110. Other components of the capacitance sensing circuit 100 shown in FIG. 1B may function similarly to the counterparts shown in FIG. 1A.

Figure 2:
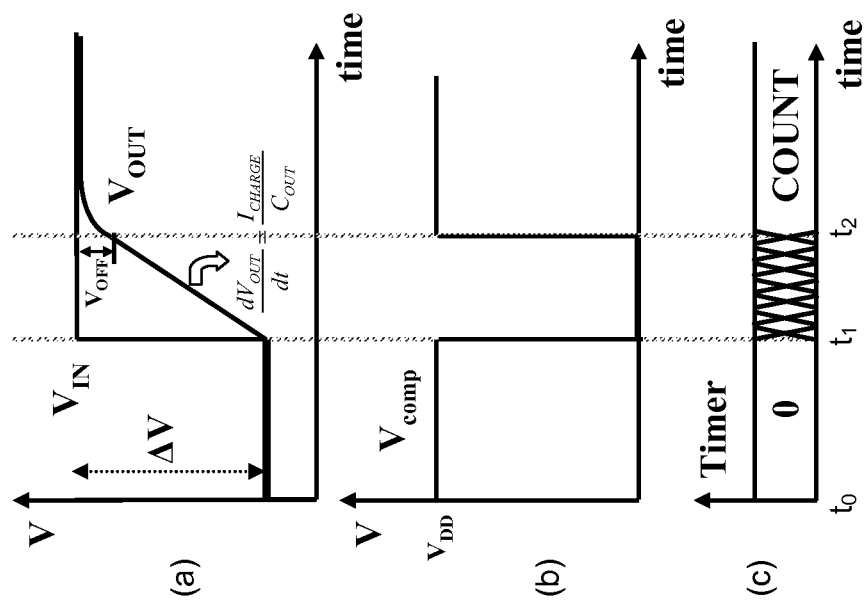
FIG. 2 is a graph illustrating exemplary signal outputs of a capacitance sensing circuit in accordance with an exemplary embodiment of the present invention.

FIG. 2 illustrates exemplary waveforms that may be generated by the system of FIG. 1. For the embodiment shown in FIG. 2, the reference voltage $V_{REF}$ may be set to be $V_{IN}$. FIG. 2(a) illustrates the output voltage $V_{OUT}$ of the amplifier 102 generated in response to an input voltage $V_{IN}$. From time $t_0$ to time $t_1$, $V_{IN}$ and $V_{OUT}$ are at the same voltage level. At time $t_1$, $V_{IN}$ may have a sudden change by an amount of $\Delta V$. The output signal $V_{OUT}$ will change during the time from $t_1$ to $t_2$ based on a capacitance $C_{OUT}$ present at the output pin 110 as follows:

$$\frac{dV_{OUT}}{dt} = \frac{I_{CHARGE}}{C_{OUT}}$$

At some time later ($t_2$), $V_{OUT}$ may reach to within a predetermined range of $V_{IN}$ and lose the linear rising rate. The counter 108 may stop counting at the time $t_2$. The count value may be read from the counter 108 and analyzed to determine the value of $C_{OUT}$. If a load device is absent, the value of $C_{OUT}$ will be low. $V_{OUT}$ may reach $V_{IN}$ almost instantly and a relatively low count value for the counter 108 will occur. By contrast, if a load device is present, a larger value of $C_{OUT}$ will be observed and a higher count value will occur.

FIG. 2(b) illustrates the comparator's output signal $V_{COMP}$ in response to waveforms of FIG. 2(a) when the output voltage $V_{OUT}$ is connected to the comparator 104 via the offset voltage $V_{OFF}$. When the input voltage $V_{IN}$ is greater than the voltage at the output pin $V_{OUT}$ plus the offset voltage $V_{OFF}$, the counter 108 is enabled. FIG. 2(c) illustrates the counter 108 counting from time $t_1$ to time $t_2$, but being disabled from counting again at time $t_2$. At time $t_2$, the comparator 104 triggers when $V_{OUT}$ reaches to within a predetermined range of $V_{IN}$. After time $t_2$, the count value may be maintained at the counter 108 until it is reset. In one embodiment, the counter 108 may be reset by a reset signal as shown in FIG. 1.

In one embodiment, the comparator 104 may be triggered when $V_{OUT}$ reaches to within a threshold offset value $V_{OFF}$ of $V_{IN}$. For the purpose of determining the capacitance $C_{OUT}$, an offset voltage $V_{OFF}$ may ensure that the amplifier 102 is still slewing (e.g., voltage change is linear) when the comparator 104 triggers. Also, the signals of the amplifier 102 and the comparator 104 may have error sources and not be as ideal as shown in FIG. 2(a). Thus, the offset voltage $V_{OFF}$ may provide a safety factor and may need to be bigger than a combined offset of the amplifier 102 and the comparator 104. The capacitance $C_{OUT}$ present at the output pin 110 may be determined as follows:

$$C_{OUT} = \frac{I_{CHARGE}}{\Delta V - V_{OFF}}(t_2 - t_1).$$

In one or more embodiments, the capacitance $C_{OUT}$ may vary with the applied voltage, thus, the input $V_{IN}$ to the amplifier 102 may keep the pin 110 at a desired voltage V and a small $\Delta V$ may help to more accurately determine the capacitance close to the desired voltage V. On the other hand, the voltage change value $\Delta V$ may be limited by the offset voltage, because $\Delta V$ must be larger than the $V_{OFF}$.

In the exemplary embodiment shown in FIG. 1, $V_{IN}$ may be connected to the inverting input and $V_{OUT}$ may be connected to the non-inverting input of the comparator 104. However, in another embodiment, the connection may be switched, e.g., $V_{IN}$ may be connected to the non-inverting input and $V_{OUT}$ may be connected to the inverting input of the comparator 104, and the offset voltage $V_{OFF}$ may be applied accordingly as well.

Figure 3:
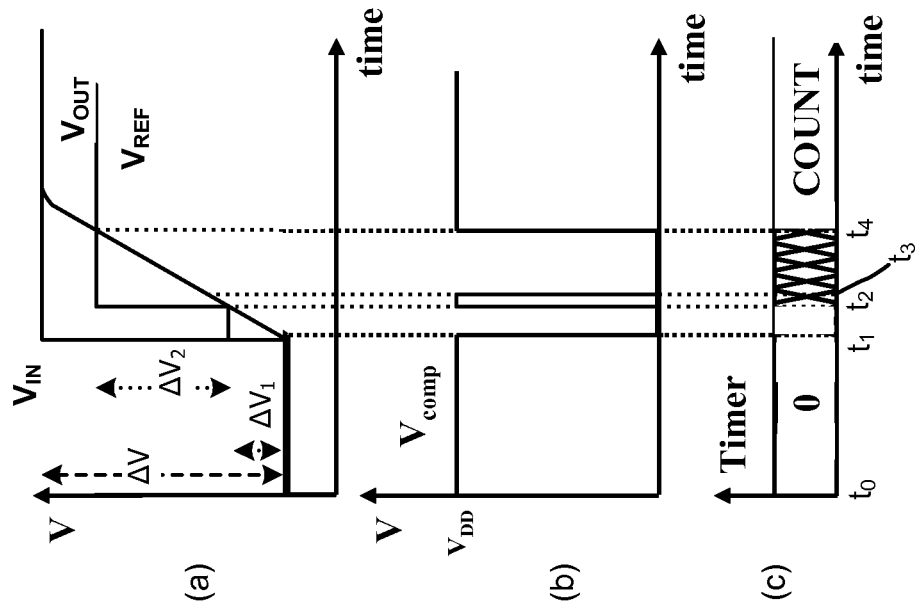
FIG. 3 is a graph illustrating exemplary signal outputs of a capacitance sensing circuit in accordance with an exemplary embodiment of the present invention.

FIG. 3 illustrates exemplary signal outputs of the capacitance sensing circuit 100 in accordance with another exemplary embodiment of the present invention. In contrast to FIG. 2, for the embodiment shown in FIG. 3, the reference voltage $V_{REF}$ may be set other than the input voltage $V_{IN}$. As shown in FIG. 3, at time $t_1$, the input $V_{IN}$ may have a step change $\Delta V$ from an initial voltage level V. Also at time $t_1$, the reference voltage $V_{REF}$ may be set to a level of $V+\Delta V_1$ with $\Delta V_1$ to be less than $\Delta V$, and thus reference voltage $V_{REF}$ to be less than the input voltage $V_{IN}$ at time $t_1$. The time $t_2$ may be determined by triggering of the comparator 104 when the output voltage $V_{OUT}$ matches the reference voltage $V_{REF}$ of $V+\Delta V_1$. The comparator 104 may trigger the counter 108 to start counting the time. At the time $t_2$, the reference voltage $V_{REF}$ may be set to a new value $V+\Delta V_1+\Delta V_2$, with $\Delta V_1+\Delta V_2$ to be less than the input change $\Delta V$ and the rise of the output voltage $V_{OUT}$ to be still linear. The comparator 104 may have a short response time $t_3-t_2$ to trigger again after the output voltage $V_{out}$ does not match reference voltage $V_{REF}$ any more. But at the time $t_3$, the counter 108 may not be affected and keep counting. At time $t_4$, the output voltage $V_{OUT}$ matches to the reference voltage $V_{REF}$ again and the comparator 104 may be triggered again. The counter 108 may then be triggered to stop counting at the time $t_4$. The capacitance $C_{OUT}$ present at the output pin 110 may be determined by the equation of:

$$C_{OUT} = \frac{I_{CHARGE} \cdot (t_4 - t_2)}{\Delta V_2}.$$

In one or more embodiments, the capacitance $C_{OUT}$ may vary according to the voltage applied to the load circuit. In one embodiment, the output voltage $V_{out}$ may be driven to a desired voltage by the input voltage $V_{IN}$. Then the step change $\Delta V$ may be applied to $V_{IN}$, and the two step changes $\Delta V_1$ and $\Delta V_2$ may be applied to reference voltage $V_{REF}$. The two step changes $\Delta V_1$ and $\Delta V_2$ may be equal or different but the output voltage $V_{OUT}$ during these two changes may be linear. Using the two triggering of the comparator may help avoid system errors (e.g., slewing and/or response delay for the comparator) because the charge period is counted between the two triggering of the comparator when $V_{OUT}$ twice matches to the reference voltage $V_{REF}$.

Figure 4:
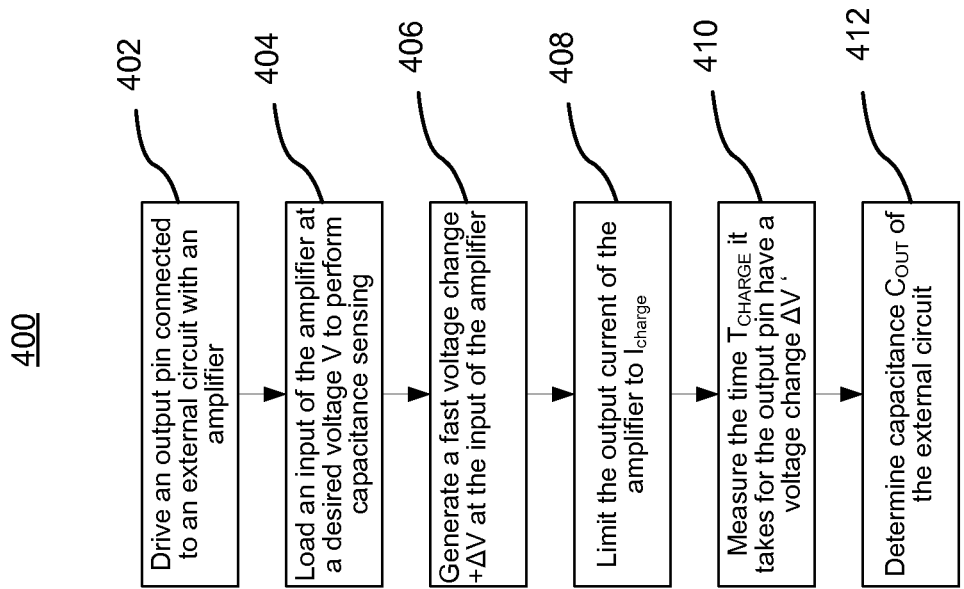
FIG. 4 is a flow diagram illustrating a process of using a capacitance sensing circuit in accordance with an exemplary embodiment of the present invention.

FIG. 4 illustrates a method 400 of using a load detector circuit in accordance with an exemplary embodiment of the present invention. The method 400 may start with step 402. At step 402, the method 400 configures an electrical circuit (e.g., a driving circuit) to drive a load circuit (e.g., a load device) with an amplifier. The amplifier may be, for example, a voltage output amplifier. As shown in FIG. 1, an exemplary embodiment may use the amplifier 102 to drive an external load device. The load device may be a motor with a capacitance $C_{OUT}$. The load device may be coupled to the output pin 110, which is electrically connected to output of the amplifier 102. Next, at step 404, the method 400 may load an input of the amplifier at a desired voltage V to perform capacitance sensing. In one or more embodiments, the capacitance of the load circuit $C_{OUT}$ may vary with the applied voltage, thus, the capacitance sensing may be performed at or about the desired voltage.

From step 404, the method 400 may proceed to step 406. At step 406, the method 400 may generate a fast voltage change $+\Delta V$ at the input of the amplifier. As describe above, the amplifier's output voltage will rise in response to the voltage change $\Delta V$ at the input. Next, at step 408, the method 400 may limit the output current of the amplifier to $I_{CHARGE}$. Thus, the load circuit may be charged by a certain current $I_{CHARGE}$. In one embodiment, the charge current $I_{CHARGE}$ may be controlled by a current source coupled to the output of the amplifier (as shown in FIG. 1). Next, the method 400 may proceed to step 410. At step 410, the method 400 may measure the time $T_{CHARGE}$ it takes for the voltage at the output pin to have a voltage change $\Delta V'$ (e.g., $\Delta V - V_{OFF}$ in FIG. 2, or $\Delta V_2$ in FIG. 3). For example, a comparator may compare the two inputs of the amplifier 102 as shown in FIG. 1. In one embodiment, an offset Voltage $V_{OFF}$ may be added to the comparator. $V_{OFF}$ may need to be bigger than the combined offset of the amplifier and the comparator. Also, an offset voltage $V_{OFF}$ may ensure that the amplifier is still slewing when the comparator triggers. $T_{CHARGE}$ may be $t_2-t_1$ as shown in FIG. 2 or $t_4-t_2$ as shown in FIG. 3.

At step 412, the capacitance $C_{OUT}$ of the load device may be determined. In one embodiment, the voltage change $\Delta V'$ may be the input voltage change with an offset value (as shown in FIG. 2), the capacitance $C_{OUT}$ may be calculated as follows:

$$C_{OUT}(V) = \frac{I_{CHARGE} \cdot T_{CHARGE}(V)}{\Delta V - V_{OFF}}.$$

In another embodiment, the voltage change $\Delta V'$ may be a change by the reference voltage $V_{REF}$, and the capacitance $C_{OUT}$ may be calculated as follows:

$$C_{OUT} = \frac{I_{CHARGE} \cdot (t_4 - t_2)}{\Delta V_2}$$

In one or more embodiment, based on the capacitance $C_{OUT}$, a determination may be made as to whether the load device is present. For example, a threshold value for the $C_{OUT}$ may be 300 picofarad (pF). That is, a $C_{OUT}$ lager than 300 pF may be sufficient for the capacitance sensing circuit 500 to determine a load (e.g., a motor) is present. And a $C_{OUT}$ less than 300 pF may show that a motor is absent.

Figure 5:
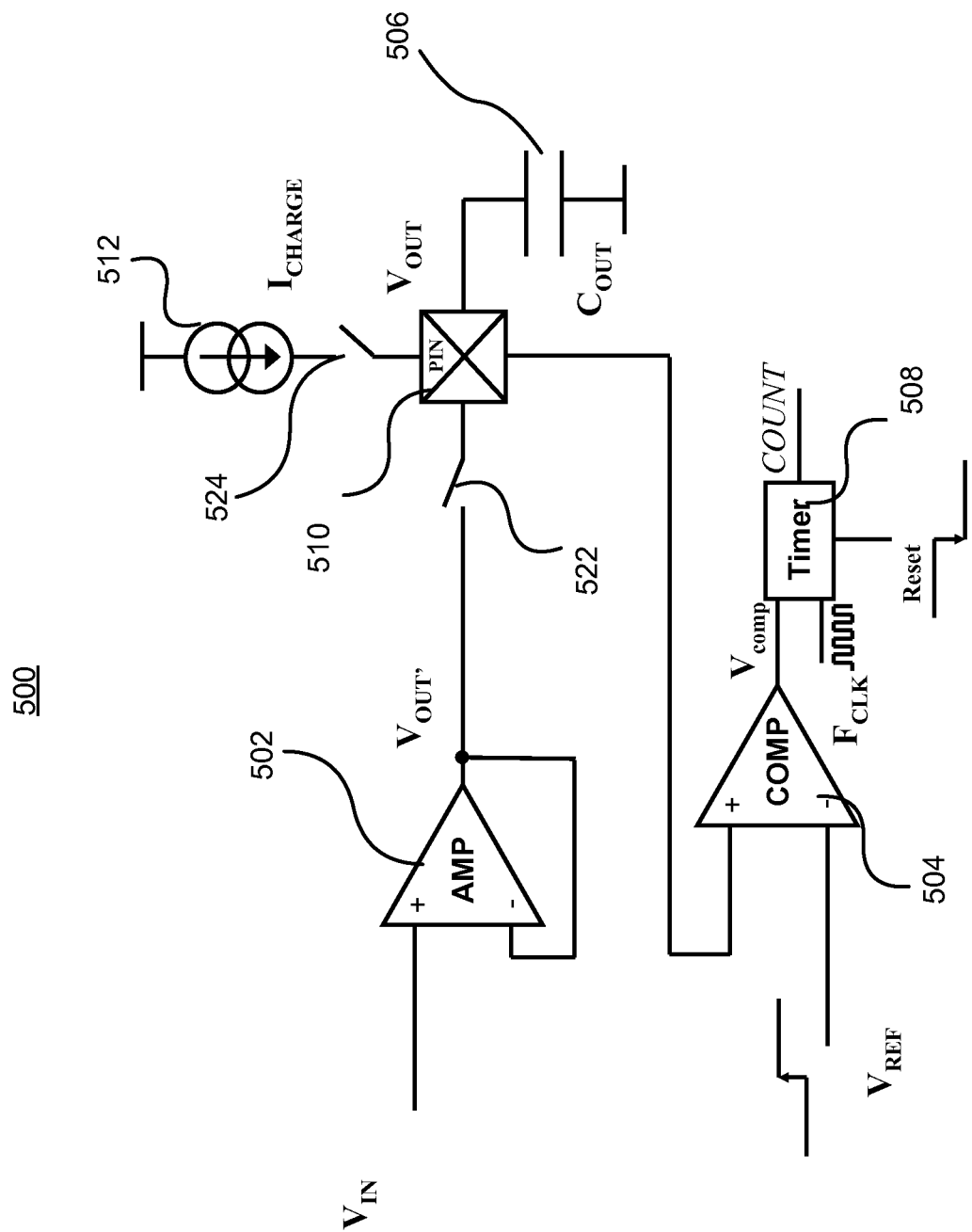
FIG. 5 is a schematic diagram of a capacitance sensing circuit in accordance with an exemplary embodiment of the present invention.

FIG. 5 illustrates a capacitance sensing circuit 500 in accordance with an exemplary embodiment of the present invention. The capacitance sensing circuit 500 may comprise an amplifier 502, a comparator 504, a counter 508, a test switch 522, a current switch 524 and a current source 512. An output pin 510 may be coupled to the output of the amplifier 502, to which a load device 506 may be electrically connected. The comparator 504 may compare the voltage level $V_{OUT}$ at the output pin 510 to a reference voltage $V_{REF}$. Based on the comparison, the counter 508 may count the time for the voltage level $V_{OUT}$ at the output pin 510 to be charged to the reference voltage $V_{REF}$. In one embodiment, the counter 508 may be part of decision logic (not shown) of the capacitance sensing circuit 500 to estimate the capacitance of the load device 506. The estimation of the capacitance may be based on the estimated response time for the load circuit coupled to the pin 510 to be charged to the reference voltage.

In some embodiments, one input of the amplifier 502 may be coupled to an output from a digital to analog converter (DAC). A second input pin of the amplifier 502 may be coupled to the output signal $V_{OUT'}$ of the amplifier 502 via a feedback path. During the operations, after the switch 522 is disconnected, the voltage level $V_{OUT}$ at the output pin 510 may be different from the output signal $V_{OUT'}$ of the amplifier 502. In one embodiment, the amplifier 502 may be a voltage output amplifier. In one embodiment, the DAC may be a 10 bits DAC (e.g., output having $2^{10}$ levels). Also, in one embodiment, the feedback signal may be coupled via a resistive divider.

During normal operations, the switch 522 may be on (e.g., connected) and the switch 524 may be off (e.g., disconnected). The amplifier 502 may drive the output (e.g., the load device 506 coupled to the output pin 510). The capacitance sensing components (e.g., the comparator 504, the counter 508 and the current source 512) may be in a standby mode.

In the capacitance sensing circuit 500, the current source 512 may be coupled to the output pin via the switch 524. This may be different from the capacitance sensing circuit 100 shown in FIG. 1, in which the charge current provided by the current source 112 may be provided via the output of the amplifier 102. In a capacitance sensing operation, the amplifier 502 may drive the output pin to a desired voltage level. Then the switch 522 may be turned off (e.g., disconnected) and the switch 524 may be turned on (e.g., connected). Afterwards, the reference voltage provided to the comparator may have a sudden change (e.g., a step change as shown in FIG. 6(a)). Thus, the output pin 510 and the external circuit (e.g., load device 506) may be driven by the current source 512. The current source 512 may be external to the amplifier 502 and not affected by the amplifier 502's operation. Thus, the rise of the output voltage $V_{OUT}$ may rise linearly. In contrast, in an embodiment according to FIG. 1, when output voltage $V_{OUT}$ (hence, the feedback input to the amplifier 102) gets closer the input voltage $V_{IN}$, the rise of the output voltage $V_{OUT}$ may not be linear.

Figure 6:
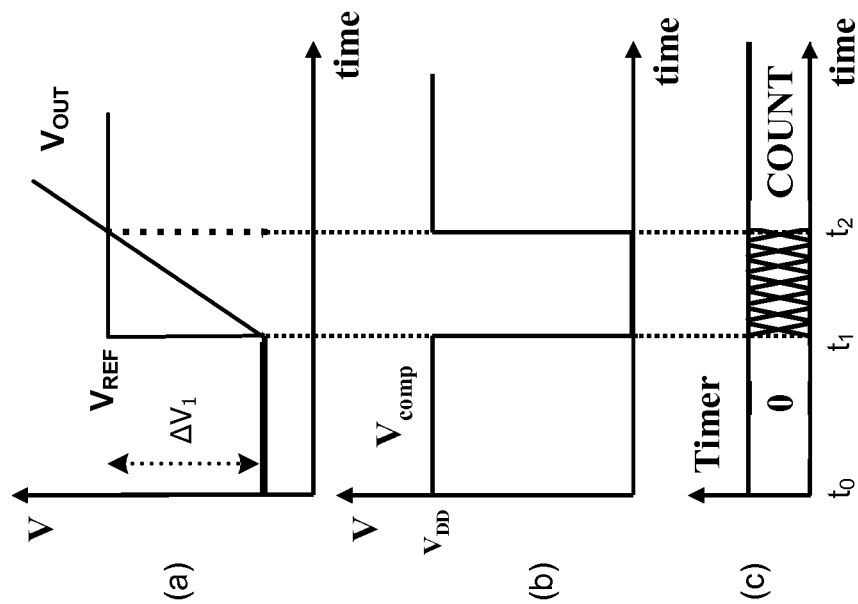
FIG. 6 is a graph illustrating exemplary signal outputs of a capacitance sensing circuit in accordance with an exemplary embodiment of the present invention.

FIG. 6 illustrates exemplary signal outputs of the capacitance sensing circuit 500 in accordance with another exemplary embodiment of the present invention. As shown in FIG. 6, at time $t_1$, the reference voltage $V_{REF}$ may be set to a level of $V+\Delta V_1$ and the comparator 504 may trigger the counter 508 to start counting the time. Also at time $t_1$, the output voltage $V_{OUT}$ at the output pin 510 may start rising in response to the switch 524 being turned on (e.g., connected) and thus the output pin 510 starting to be charged by the current source 512. At the time $t_2$, the output voltage $V_{OUT}$ matches to the reference voltage $V_{REF}$ and the comparator 104 may be triggered to send a signal to stop the counter 508. The capacitance $C_{OUT}$ present at the output pin 110 may be determined by the equation of:

$$C_{OUT} = \frac{I_{CHARGE} \cdot (t_2 - t_1)}{\Delta V_1}.$$

Figure 7:
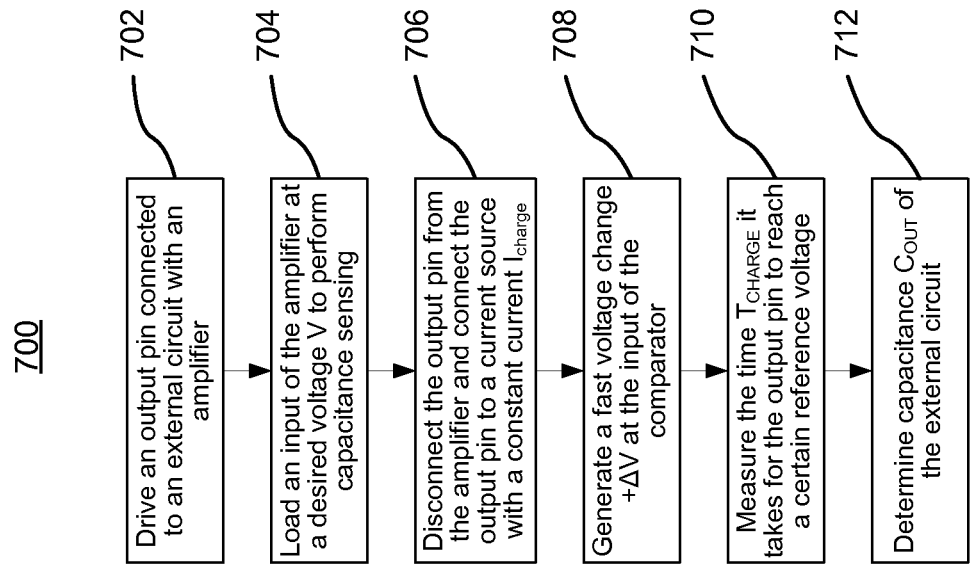
FIG. 7 is a flow diagram illustrating a process of using a capacitance sensing circuit in accordance with an exemplary embodiment of the present invention.

FIG. 7 illustrates a method 700 of using a load detector circuit in accordance with an exemplary embodiment of the present invention. The method 700 may be used by the capacitance sensing circuit 500. The method 400 may start with step 402. At step 402, the method 400 configures an electrical circuit (e.g., a driving circuit) to drive a load circuit (e.g., a load device) with an amplifier. The amplifier may be, for example, a voltage output amplifier. As shown in FIG. 5, an exemplary embodiment may use the amplifier 502 to drive an external load device. The load device may be a motor with a capacitance $C_{OUT}$. The load device may be coupled to the output pin 510, which is electrically connected to output of the amplifier 502 via a switch 522. Next, at step 704, the method 700 may load an input of the amplifier at a desired voltage V to perform capacitance sensing. In one or more embodiments, the capacitance of the load circuit $C_{OUT}$ may vary with the applied voltage, thus, the capacitance sensing may be performed at or about the desired voltage.

From step 704, the method 700 may proceed to step 706. At step 706, the method 700 may disconnect the output pin 510 from the amplifier 502 and connect the output pin 510 to the current source 512. Thus, in FIG. 5, the switch 522 may be disconnected, switch 524 may be connected, and the current source 512 may start to charge the load circuit at the output pin 510 with a constant charge current $I_{CHARGE}$. Next, the method may proceed to step 508. At step 508, the method 700 may generate a fast voltage change $+\Delta V_1$ at the input of the comparator 504 (e.g., the reference voltage $V_{REF}$ is set to $V+\Delta V_1$). But, as the switch 522 is disconnected, the output voltage $V_{OUT}'$ from the amplifier 502 will not affect the charge rate for the output pin 510. Next, the method 700 may proceed to step 710. At step 710, the method 700 may measure the time $T_{CHARGE}$ it takes for the voltage at the output pin 510 to reach the reference voltage $V_{REF}$ (e.g., $V+V_1$ in FIG. 6(a)). For example, the comparator 504 may control the counter 508 to count the charge time period between $t_1$ and $t_2$.

At step 712, the capacitance $C_{OUT}$ of the load device may be determined. For example, based the voltage change $\Delta V1$ of the reference voltage $V_{REF}$, and the capacitance $C_{OUT}$ may be calculated as follows:

$$C_{OUT} = \frac{I_{CHARGE} \cdot (t_2 - t_1)}{\Delta V_1}.$$

In one or more embodiments, a current source (e.g., current source 112, or current source 512) may be a current sink and the capacitance $C_{OUT}$ at the output pin may be calculated (e.g., estimated) by a discharge current $I_{DISCHARGE}$. That is, a current sink (e.g., a current drain) may be coupled to the output pin to drain electrical charges from the output pin (e.g., a load coupled thereon) to ground. With a discharge current $I_{DISCHARGE}$, the voltage changes $\Delta V$s as discussed above may be negative changes (e.g., decreases instead of increases). Triggering of the amplifiers and comparators may be similar but the discharging slope for the output voltage $V_{OUT}$ may be a decline slope instead of a rising slope, and the counter may count time similarly by using reference voltages to start and/ or stop, as for charging periods. The capacitance may be calculated using the absolute value of the voltage changes. For example, if no offset voltage is used, the capacitance may be calculated as follows:

$$C_{OUT}(V) = \frac{I_{DISCHARGE} \cdot T_{DISCHARGE}(V)}{|\Delta V|}.$$

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:

1. A method for testing capacitance of a load circuit connected to an output pin of a driving circuit, comprising:
   receiving a first voltage at a first input of a voltage output amplifier;
   driving a voltage at the output pin to the first voltage using the voltage output amplifier, the output pin being coupled to an output of the voltage output amplifier;
   receiving a sudden voltage change at the first input of the voltage output amplifier;
   triggering an onset of a timed voltage change period;
   controlling, by a current source, an output current of the voltage output amplifier that charges the output pin;
   comparing the voltage at the output pin to a reference voltage; and
   when the voltage at the output pin matches the reference voltage, generating an estimate of capacitance present at the output pin based on a number of clock cycles occurring between the onset of the timed voltage change period and a time at which the voltage at the output pin matches the reference voltage,
   wherein the timed voltage change period starts in response to the voltage at the output pin matching to a first value of the reference voltage after the sudden voltage change at the first input of the voltage output amplifier and ends in response to the voltage at the output pin matching to a second value of the reference voltage.

2. The method of claim 1, wherein the capacitance varies based upon the voltage at the output pin and the first voltage is a desired voltage for the load circuit.

3. The method of claim 1, wherein comparing the voltage is performed by a comparator with a first input coupled to the output pin and a second input coupled to the reference voltage.

4. The method of claim 3, wherein the load circuit includes a motor and the voltage output amplifier outputs control signals from a digital-to-analog converter.

5. The method of claim 4, wherein the current source is provided in the voltage output amplifier and connected to the output pin in a current-limited mode.

6. The method of claim 5, whereinthe first value of the reference voltage is less than the second value of the reference voltage, and the second value of the reference voltage is less than the first voltage and the sudden voltage change combined.

7. The method of claim 4, wherein the current source is provided separate from the voltage output amplifier.

8. The method of claim 7, wherein the onset of the timed voltage change period is triggered by connecting the current source to the output pin, the reference voltage is equal to the first voltage and the voltage change combined.

9. The method of claim 1, wherein the output pin is coupled to an input of the comparator via an offset voltage and the reference voltage is equal to the first voltage and the sudden voltage change combined.

10. The method of claim 1, wherein the current source provides a charge current and the output pin is charged during the timed voltage change period.

11. The method of claim 1, wherein the current source provides a sink current and the output pin is discharged during the timed voltage change period.

12. A system for testing capacitance of a load circuit coupled to an output pin of an electrical circuit, comprising:
a driving amplifier having an output coupled to the output pin to drive the output pin to an input voltage, wherein a first input of the amplifier is coupled to an input signal having the input voltage and a second input of the amplifier is coupled to the output of the amplifier;
a current source coupled to the output pin through an output stage of the amplifier to control a current flowing from the driving amplifier to the output pin during a testing period;
a comparator having inputs coupled to the output pin and to a reference voltage; and
a decision logic coupled to an output of the comparator, to determine capacitance present at the output pin based on a response of time of the voltage at the output pin,
wherein the decision logic includes a counter, and
wherein the counter counts a timed voltage change period determined by starting the counter in response to the voltage at the output reaching a first value of the reference voltage after a step change is applied to the input signal, and stopping the counter in response to the voltage at the output pin reaching a second value of the reference voltage.

13. The system of claim 12, wherein the counter counts the timed voltage change period for the output pin to match the reference voltage, and the decision logic uses the timed voltage change period, the charge current and rate of charge to determine the capacitance of the load circuit coupled to the output pin.

14. The system of claim 13, wherein the reference voltage is provided by the input signal, and the output pin is coupled to the comparator via an offset voltage.

15. The system of claim 14, wherein the timed voltage change period is determined by starting the counter when a step change is applied to the input signal and stopping the counter when the voltage at the output pin reaches the reference voltage minus the offset voltage.

16. The system of claim 12, wherein the amplifier is a voltage output amplifier, the load circuit includes a motor and the amplifier outputs control signals for the motor from a digital to analog converter.

17. The system of claim 12, wherein the capacitance of the load circuit varies with the voltage at the output pin.

18. The system of claim 12, wherein the current is a charge current and the output pin is charged during the timed voltage change period.

19. The system of claim 12, wherein the current is a sink current and the output pin is discharged during the timed voltage change period.

20. A system for testing capacitance of a load circuit coupled to an output pin of an electrical circuit, comprising:
a first and second electrical switches;
a driving amplifier having an output coupled to the output pin via the first switch to drive the output pin to an input voltage, wherein a first input of the amplifier is coupled to an input signal having the input voltage and a second input of the amplifier is coupled to the output of the amplifier;
a current source selectively coupled to the output pin via the second switch, the current source to apply a current to the output pin during a testing period;
a comparator having inputs coupled to the output pin and to a reference voltage; and
a decision logic coupled to an output of the comparator, to determine capacitance present at the output pin based on a response of time of the voltage at the output pin,
wherein the decision logic includes a counter that counts a timed voltage change period determined by starting the counter in response to the voltage at the output reaching a first value of the reference voltage after a step change is applied to the input signal, and stopping the counter in response to the voltage at the output pin reaching a second value of the reference voltage.

21. The system of claim 20, wherein the counter counts the timed voltage change period for the output pin to be charged from a desired voltage for the output pin to the reference voltage, and the decision logic uses the timed voltage change period, the current and rate of change to determine the capacitance of the load circuit coupled to the output pin.

22. The system of claim 21, wherein the timed voltage change period is determined by starting the timer when the second switch is connected and stopping the timer when the voltage at the output pin reaches the reference voltage.

23. The system of claim 20, wherein the amplifier is a voltage output amplifier, the load circuit includes a motor and the amplifier outputs control signals for the motor from a digital to analog converter.

24. The system of claim 20, wherein the capacitance of the load circuit varies with the voltage at the output pin.

25. The system of claim 20, wherein the current is a discharge current and the output pin is discharged during the timed voltage change period.

26. The system of claim 20, wherein the current is a charge current and the output pin is charged during the timed voltage change period.

* * * * *

UNITED STATES PATENT AND TRADEMARK OFFICE
CERTIFICATE OF CORRECTION

PATENT NO. : 8,866,499 B2  
APPLICATION NO. : 12/548540  
DATED : October 21, 2014  
INVENTOR(S) : Santiago Iriarte et al.

It is certified that error appears in the above-identified patent and that said Letters Patent is hereby corrected as shown below:

On Title page, Item "(57) Abstract", please change the second line as follows:

"a driving circuit In" to --a driving circuit. In--;

In The Claims

In Claim 6, Column 8, line 57, please change:

"whereinthe" to --wherein the--.

Signed and Sealed this
Twenty-third Day of June, 2015

Michelle K. Lee
*Director of the United States Patent and Trademark Office*